(12) United States Patent
Gopalakrishnan et al.

(10) Patent No.: US 12,002,674 B2
(45) Date of Patent: Jun. 4, 2024

(54) MACROMOLECULAR SIEVES FROM SEMICONDUCTOR MEMBRANES FOR SHAPE-BASED SEPARATION AND SENSING

(71) Applicant: WiSys Technology Foundation, Inc., Madison, WI (US)

(72) Inventors: Gokul Gopalakrishnan, Plateville, WI (US); Mark Elliot Levenstein, Madison, WI (US)

(73) Assignee: WiSys Technology Foundation, Inc., Madison, WI (US)

( * ) Notice: Subject to any disclaimer, the term of this patent is extended or adjusted under 35 U.S.C. 154(b) by 846 days.

(21) Appl. No.: 17/045,545

(22) PCT Filed: Apr. 11, 2019

(86) PCT No.: PCT/US2019/026914
§ 371 (c)(1),
(2) Date: Oct. 6, 2020

(87) PCT Pub. No.: WO2019/200049
PCT Pub. Date: Oct. 17, 2019

(65) Prior Publication Data
US 2021/0166938 A1 Jun. 3, 2021

Related U.S. Application Data

(60) Provisional application No. 62/656,021, filed on Apr. 11, 2018.

(51) Int. Cl.
*H01L 21/027* (2006.01)
*G03F 7/16* (2006.01)
(Continued)

(52) U.S. Cl.
CPC .......... *H01L 21/0274* (2013.01); *G03F 7/167* (2013.01); *G03F 7/2004* (2013.01);
(Continued)

(58) Field of Classification Search
CPC ...... G03F 7/095; G03F 7/0382; G03F 7/0758; H01L 27/14806; H01L 27/14634;
(Continued)

(56) References Cited

U.S. PATENT DOCUMENTS 7,501,279 B2   3/2009  Folch et al.
8,512,588 B2   8/2013  Tringe et al.
(Continued)

FOREIGN PATENT DOCUMENTS

CN        101016630        8/2007
WO       WO2005-015308     2/2005

OTHER PUBLICATIONS

Fu et al., "Artificial molecular sieves and filters: a new paradigm for biomolecule separation," *Trends in Biotechnology*, vol. 26, No. 6, available online Apr. 20, 2008, pp. 311-320.
(Continued)

*Primary Examiner* — David E Smith
*Assistant Examiner* — Hsien C Tsai
(74) *Attorney, Agent, or Firm* — Bell & Manning LLC

(57) ABSTRACT

Methods for making molecular sieves are provided. The molecular sieves are comprised of thin semiconductors films in which a plurality of apertures is defined. The apertures are non-circular, nanoscale openings with tapered sidewalls that selectively pass certain molecules, while discriminating against the passage of other molecules.

19 Claims, 7 Drawing Sheets

(51) Int. Cl.
 *G03F 7/20* (2006.01)
 *H01L 21/033* (2006.01)
 *H01L 21/3213* (2006.01)

(52) U.S. Cl.
 CPC ...... *H01L 21/0332* (2013.01); *H01L 21/0337* (2013.01); *H01L 21/32139* (2013.01)

(58) Field of Classification Search
 CPC ........... H01L 27/14607; H01L 21/0273; H01L 21/31144; H01L 21/3065; H01L 21/76898
 See application file for complete search history.

(56) References Cited

U.S. PATENT DOCUMENTS

| | | | |
|---|---|---|---|
| 9,195,152 B2 * | 11/2015 | Soer | G03F 7/70575 |
| 9,768,059 B1 * | 9/2017 | Liu | G03F 7/0002 |
| 2004/0106064 A1 * | 6/2004 | Choi | G03F 7/0758 |
| | | | 430/905 |
| 2007/0108160 A1 * | 5/2007 | Ngo | H01L 27/14806 |
| | | | 700/121 |
| 2010/0022089 A1 | 1/2010 | Takei et al. | |

OTHER PUBLICATIONS

Han et al., "Molecular sieving using nanofilters: past, present and future," *Lab Chip*, 2008, 23-33.
K. Westra, "KOH and TMAH Etching of Bulk Silicon Recipes, Tricks, What is Possible, and What is Impossible," *Can*, (100), pp. 1-3 Feb. 11, 2010.
International Search Report and Written Opinion for PCT/US2019/026914, mailed Jul. 29, 2019.

\* cited by examiner

FIG. 4

| Elementary Shapes | Derived Shapes | Examples |
|---|---|---|
| Square | Rectangle | Bacillus (E. Coli, Salmonella, Atropaheus, Gingivalis), diplococci, cocci tetrad, cocci sarcina, streptococci |
| L Shape | U Shape | Vibrios, spirilla, sporochates |
| Truncated square | Octagon | staphylococci, viruses, phages |
| Z-shape W | Chains | Spirilla, chain of streptococci, chain of bacilli, streptococci |

MACROMOLECULAR SIEVES FROM SEMICONDUCTOR MEMBRANES FOR SHAPE-BASED SEPARATION AND SENSING

CROSS-REFERENCE TO RELATED APPLICATIONS

This application is a National Stage of International Application No. PCT/US19/26914, filed Apr. 11, 2019, which claims the benefit of U.S. Patent Application No. 62/656,021, filed Apr. 11, 2018, the contents of which are herein incorporated by reference.

BACKGROUND

Conventional molecule filtration systems based on molecular weight typically utilize a system of cylindrical pores and separate molecules based on the average size of a molecule of particular mass. However, the overall three-dimensional structures of macromolecules vary widely, and conventional molecule filtration systems are unable to discriminate between molecules based on molecular shape. Furthermore, the impedance against fluid flow increases with decreasing pore size, and the time to pass fluid samples across membranes with small nanoscale cylindrical pores can become inordinately long.

One challenge faced by the industry is that electron beam lithography, which can be used to form openings in a substrate is expensive and not easily scalable. Bottom up methods have also been used, but these provide poor pore size control and precision and have a limited capacity to form pores of a variety of shapes.

SUMMARY

Methods for making molecular sieves are provided. One embodiment of a method includes the steps of: depositing a layer of masking material comprising low-stress silicon nitride, chromium, chromium oxide, or a chromium-gold multilayer onto a single-crystalline semiconductor membrane; depositing an electron beam sensitive polymer over the layer of masking material; patterning an array of holes into the electron beam sensitive polymer via electron beam lithography; transferring the pattern of holes into the layer of masking material using a plasma- or wet chemical-etch to form a mask; and etching a pattern of apertures into the single-crystalline semiconductor membrane using the mask and an anisotropic chemical etch. The apertures extend through the single-crystalline semiconductor membrane from an upper opening to a lower opening and have a tapered depth profile. In some embodiments, the lower openings have at least one lateral dimension that is smaller than 5 μm, including embodiments in which the lower opening has at least one lateral dimension that is smaller than 1 μm.

Another embodiment of a method of fabricating a molecular sieve, includes the steps of: depositing a layer of masking material comprising silicon nitride, chromium, chromium oxide, or a chromium-gold multilayer onto a single-crystalline semiconductor membrane; depositing an UV photoresist layer over the layer of masking material; patterning an array of holes into the UV photoresist layer via UV photolithography; transferring the pattern of holes into the layer of masking material using a plasma or wet chemical etch to form a mask; and etching a pattern of apertures into the single-crystalline semiconductor membrane using the mask and an anisotropic chemical etch. In some embodiments, the lower openings have at least one lateral dimension that is smaller than 5 μm, including embodiments in which the lower opening has at least one lateral dimension that is smaller than 1 μm.

BRIEF DESCRIPTION OF THE DRAWINGS

Illustrative embodiments of the invention will hereafter be described with reference to the accompanying drawings, wherein like numerals denote like elements.

FIG. 4 shows different apertures shapes for a molecular sieve, along with examples of biomolecules (e.g., bacteria, (e.g., mycoplasma) proteins, and viruses) that could be selectively retained or filtered out of a sample using each aperture shape.

DETAILED DESCRIPTION

Molecular sieves, methods for making the molecular sieves, and methods for using the molecular sieves for separating and sensing molecules based on their shapes are provided.

The molecular sieves are comprised of thin semiconductor films in which a plurality of apertures is defined. The apertures are non-circular, openings that selectively pass certain molecules, while discriminating against the passage of other molecules, based on the shapes and/or sizes of the molecules in a sample. In some embodiments, the openings are nanoscale openings. As used herein, the term nanoscale means having at least one size dimension, for example, width, height and/or depth, that is smaller than 1 μm.

Using the methods described herein, apertures having a variety of non-circular shapes and tapered depth profiles can be fabricated. By way of illustration, the apertures may be square-shaped with a tapered depth profile. Alternatively, the apertures may be rectangular in shape with a tapered depth profile. However, other aperture shapes can be used, including L-shaped apertures, U-shaped apertures, truncated square-shaped apertures (i.e., a five-sided figure resulting from cutting across one corner of a square), octagon-shaped apertures, z-shaped apertures, and chains of z-shaped apertures. These types of aperture shapes are illustrated in the table of FIG. 4. The apertures define an opening on the order of the size of the biomolecules to be filtered. The smallest opening dimension of an aperture can be in the range from about 10 nm to about 1 μm, although sizes outside of this range can be used. Moreover, a molecular sieve may include apertures having different shapes and/or sizes.

By utilizing specifically shaped nanoscale openings, the molecular sieves exploit the structure-function relationship and the ability to separate molecules by shape in addition to size. This is particularly useful in the separation and/or detection of biomolecules that exhibit differences in shape despite being comparable in size. By way of illustration, the table in FIG. 4 lists types of biomolecules that may be selectively filtered using apertures of different shapes. By selectively passing molecules based on their shapes in addition to their sizes, the molecular sieves are able to separate, detect, and/or align a variety of different particles and macromolecules, including biological species, that have high-aspect ratio (i.e., non-globular) shapes. For example, the sieves can be used to separate globular proteins from fibrous proteins by passing a solution containing both types of proteins through the sieve. Although the sieves are well-suited for the separation of different types of biomolecules, they also can be used to separate inorganic materials and to separate inorganic structures from organic molecules.

Figure 3:
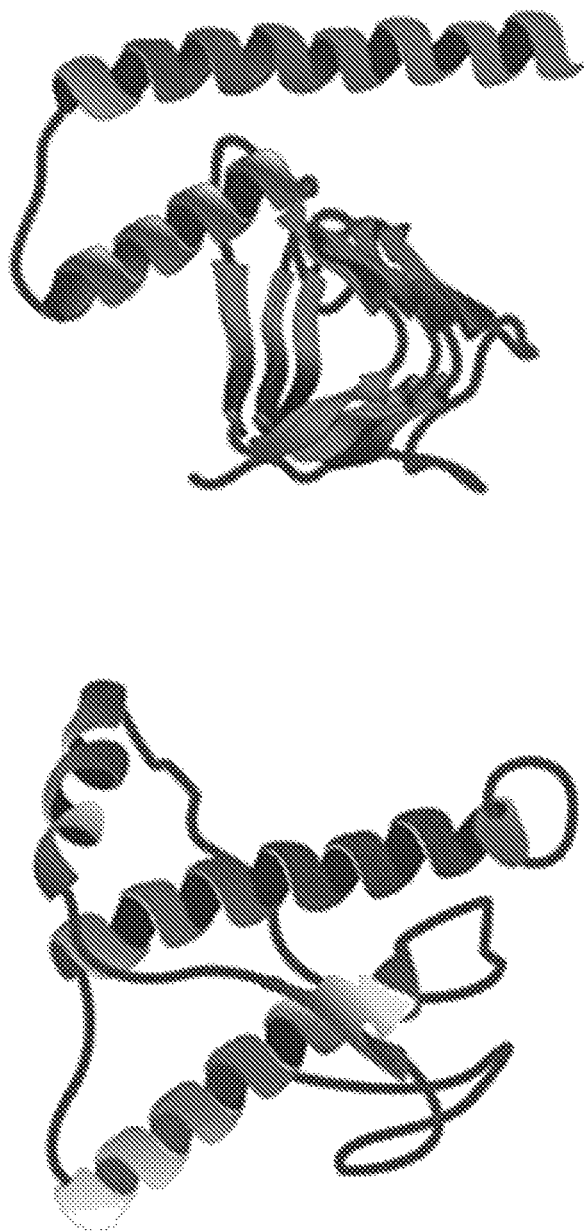
FIG. 3 shows the differences in the shapes of a normal prion (left panel) and a chronic wasting disease-causing prion (right panel).

The sieves have applications in the field of chromatography, where separations can be based on the class of molecule. Clinically, the sieves can be used as filters for specific molecules, such as a mutated form of a cancer-causing protein, or to separate a diseased form of chronic wasting disease prions from a complex mixture of proteins. FIG. 3 shows the structure of a normal prion protein and a disease-causing prion. As can be seen in the figure, the two prions have similar sizes but different shapes. As a result, the present sieves can more effectively separate the prions than a conventional molecular sieve. In another illustrative example, the sieves can be used to separate and quantify cancer biomarkers from a sample, thereby allowing for the determination of appropriate doses of therapeutic agents (monoclonal antibodies) to be administered to a patient.

In addition to separating molecules in a sample, the sieves can be used to align high aspect ratio molecules, such as carbon nanotubes and inorganic nanorods, along their longitudinal axes. Sieves with larger slit-shaped openings (e.g., several (e.g., 3-10) μm wide)) can be used to align organic and inorganic microfibers (for instance, polymer microfibers used for oriented cell growth, or glass and carbon fibers used as fillers in composite materials).

Figure 1:
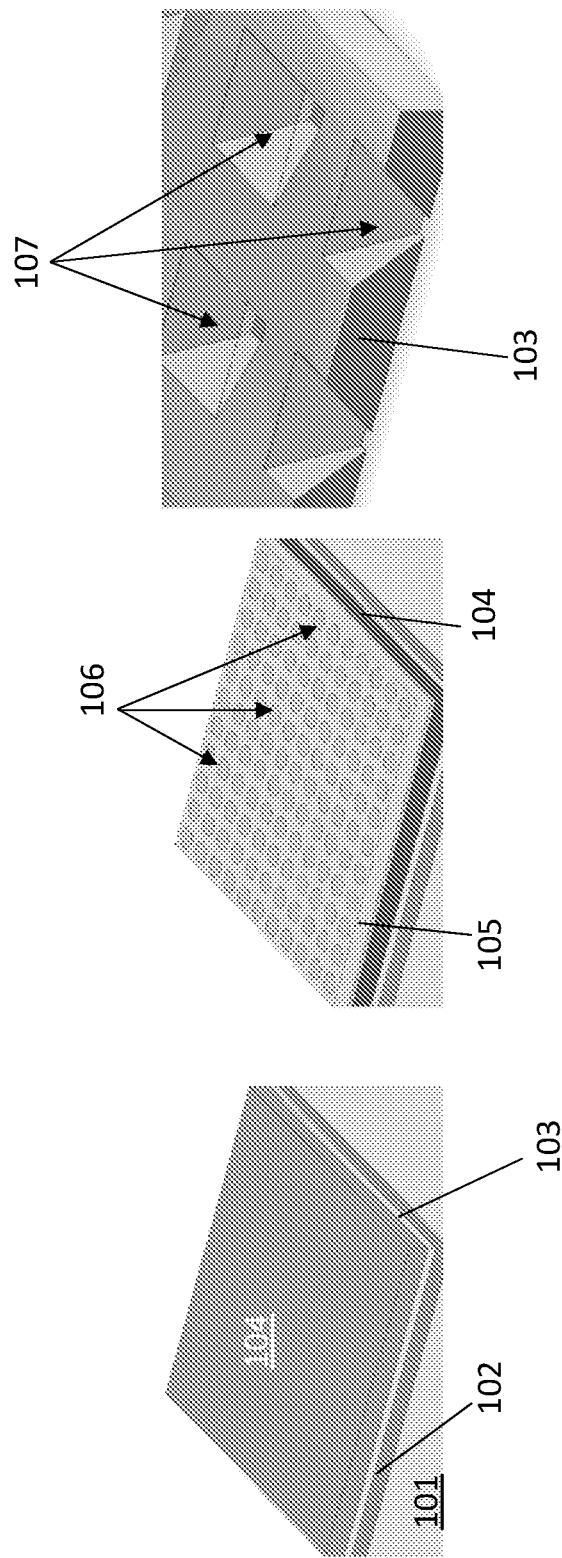
FIG. 1 is a schematic illustration of a method for forming a molecular sieve from the device layer of a semiconductor-on-insulator wafer.

The molecular sieves can be made starting with a semiconductor-on-insulator substrate that includes a handle wafer substrate 101, a single-crystal semiconductor device layer 103 and a buried oxide (BOX) 102 layer separating handle wafer substrate 101 from device layer 103, as shown in FIG. 1. In some embodiments of the methods, a silicon-on-insulator wafer substrate is used. First, a layer of etch-resistant masking material 104 is deposited on the surface of the device layer 103. The device layer is a thin layer of single-crystalline semiconductor, such as silicon, germanium, or silicon-germanium, and provides the semiconductor thin film ("semiconductor nanomembrane"). The etch-resistant masking material can be a multilayered structure that includes an etch-resistant metal layer, such as chromium, chromium oxide, a chromium-gold alloy, or silicon nitride deposited on device layer 103 and a layer of electrically insulating material, such as a nitride (e.g., silicon nitride), deposited on the metal layer. Next, an electron beam sensitive polymer 105 is deposited over etch-resistant masking material 104 by, for example, spin-coating. Examples of suitable electron beam sensitive polymers that can be used as positive photoresists include polymethyl methacrylate, methyl styrene-chloromethyl acrylate copolymers. Electron beam lithography is then used to pattern an array of nanoscale holes 106 into the electron beam sensitive polymer 105. The holes may be, but need not be, patterned in a regular array. The electron beam lithography can create holes having openings with diameters of, for example, less than 5 μm. The pattern of holes in the electron beam sensitive polymer is then transferred into the etch-resistant masking material via a plasma etch or a wet chemical etch. For example, using the polymer layer as a mask, holes can be formed in a chromium or chromium-gold alloy layer using a $CCl_4$ plasma etch. Holes can be formed in a silicon nitride layer using a $CF_4$ or $SF_6$ plasma etch. This etched layer serves as an etch mask for the underlying semiconductor nanomembrane.

An anisotropic chemical etch, such as a potassium hydroxide etch or a tetramethyl ammonium hydroxide (TMAH) etch, is then used to etch apertures 107 through nanomembrane 103 with useful geometries. The anisotropic etch enables the formation of non-circular apertures with tapered sidewalls that narrow down at very specific angles to make a very small opening at the other end. As a result, the lower openings of the apertures can have dimensions of 100 nm or smaller, 50 nm or smaller, or 20 nm or smaller. For example, openings with sizes in the range from 1 to 10 nm can be fabricated. For the purposes of this disclosure, the "lower" opening refers to the opening in the surface of the semiconductor nanomembrane that is opposite the surface of the nanomembrane at which the etching begins.

The patterned semiconductor nanomembrane can be formed as a suspended semiconductor nanomembrane, of the type described in Gopalakrishnan et al., *Appl. Phys. Lett.* 102, 033113 (2013), the entire disclosure of which is incorporated herein for the purpose of describing a method for forming a suspended semiconductor nanomembrane in a metastable state. Alternatively, the patterned semiconductor nanomembrane can be formed in a supported device layer as described above, which is then released and transfer printed onto a sieve support substrate. The sieves can have a thickness in the range from about 5 nm to about 500 nm. However, sieves having thicknesses outside of this range can also be formed.

Figure 2:
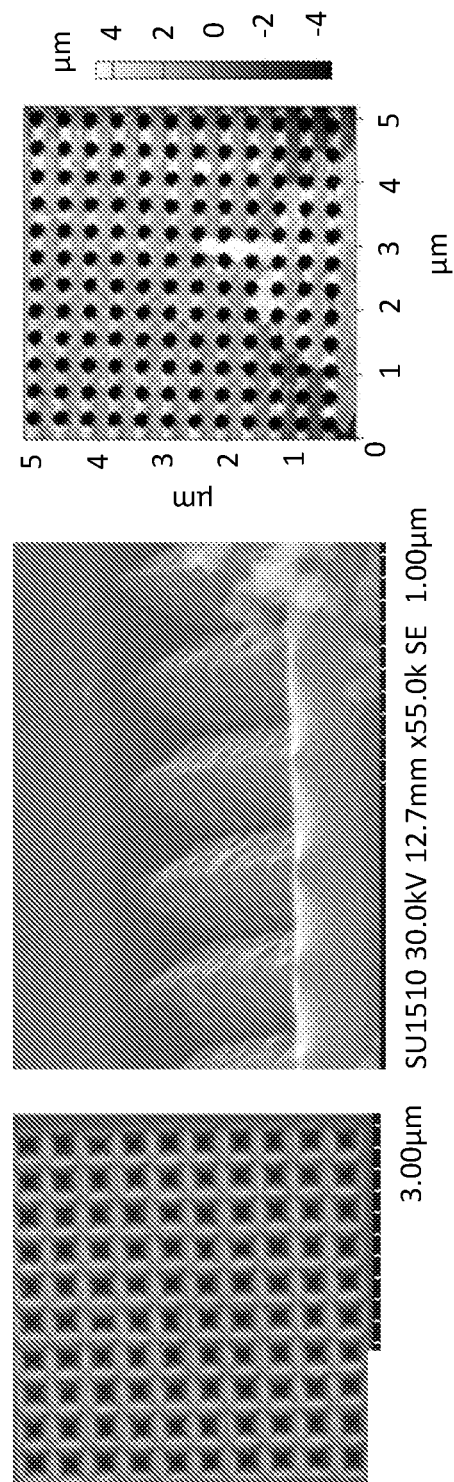
FIG. 2 shows images of molecular sieves having non-circular, nanoscale openings (left and middle) and an electron beam patterned surface with a cylindrical pore geometry (right). The sieves were made according to the procedures described in the Example.
Figure 5:
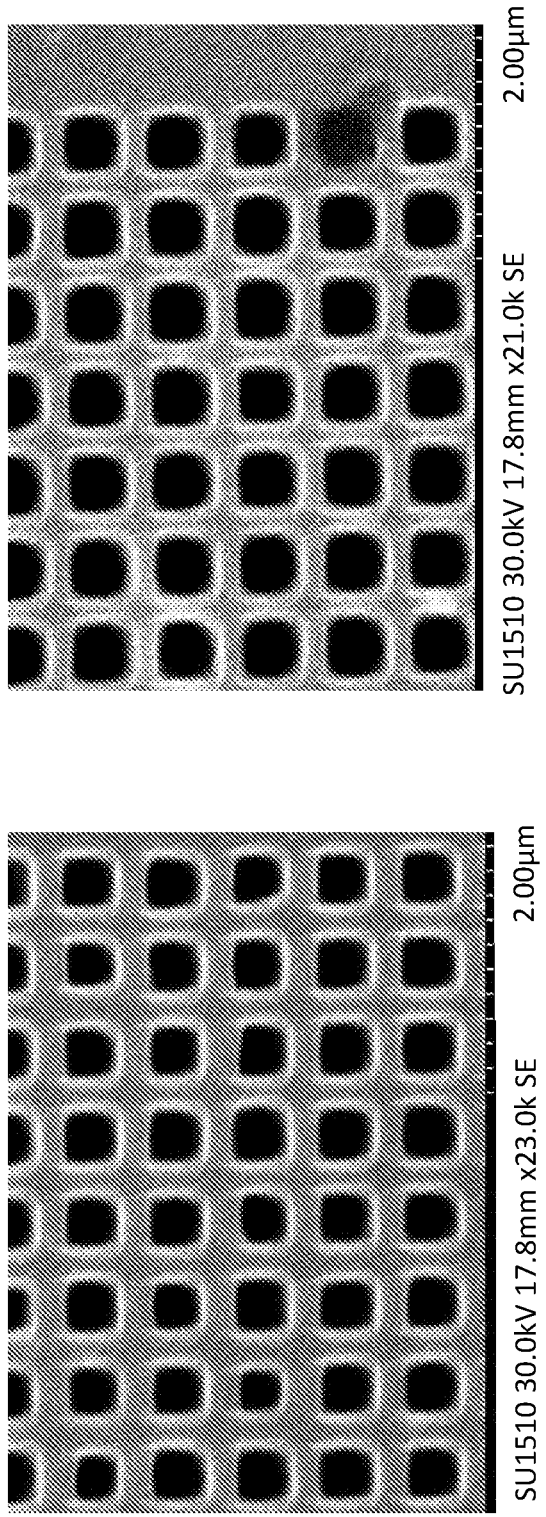
FIG. 5 is an image of two sieves having nanoscale (~400 nm, left panel; ~450 nm, right panel) square-shaped openings that were fabricated as described in the Example.
Figure 6:
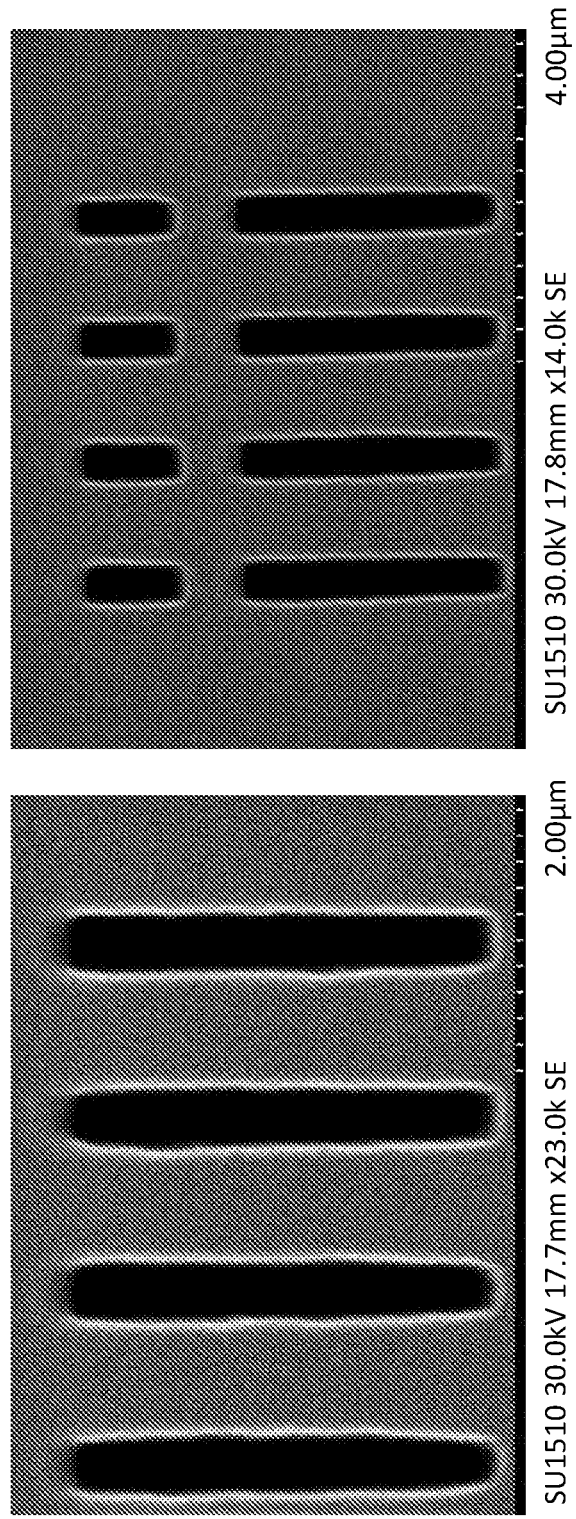
FIG. 6 is an image of two sieves having nanoscale (~400 nm, left panel; ~450 nm, right panel) rectangular-shaped openings of different lengths that were fabricated as described in the Example.
Figure 7:
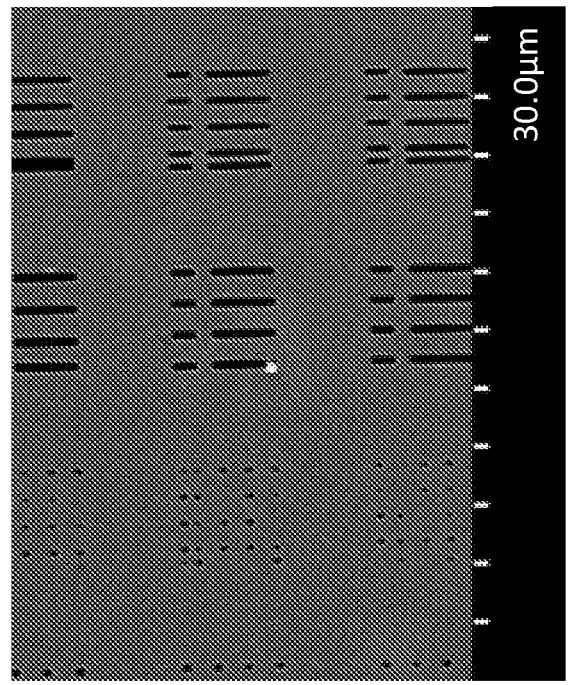
FIG. 7 is an image of a sieve having an array square holes (left panel) and a sieve having an array of rectangular holes (right panel) that were fabricated as described in the Example.
Figure 7:
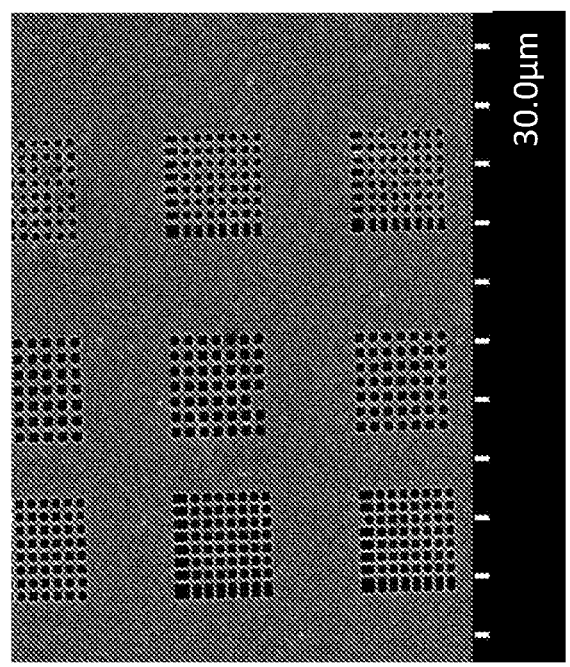

FIG. 2 shows scanning electron microscope (SEM) images of molecular sieves made according to this process, as described in more detail in the Example. Additional details regarding the fabrication are provided in the Example. The left and middle panels show molecular sieves with nanoscale openings with pyramidal pore geometries. The right panel shows an atomic force microscope (AFM) image of an electron beam patterned and developed surface of the electron beam resist layer. FIG. 5, FIG. 6, and FIG. 7 show SEM images of additional embodiments of molecular sieves made in accordance with the processes described in the Example.

Advantages of the sieve fabrication processes described herein include the ability to form sieves with holes having at least one lateral dimension that is smaller than 5000 nm, 1000 nm, smaller than 500 nm, smaller than 100 nm, and smaller than 50 nm; the ability to provide sieve nanomembranes having an open area fraction of at least 25%, including open area fractions of at least 30%, and open area fractions of at least 40%; the ability to provide apertures with low standard deviations in their size dimensions, including hole dimension standard deviations of less than 3%, and hole dimension standard deviations of less than 2%; and/or the ability to provide membrane sieves with low-impedance pore geometries for faster filtration.

EXAMPLE

Substrate Cleaning. The starting material used was a silicon-on-insulator (SOI) wafer with 100-orientation (silicon device layer=100-5000 nm, buried oxide layer=0.4-5 μm, silicon handle wafer=300-750 μm). For a pre-furnace cleaning, the following cleaning solutions and steps were used: Piranha solution, ammonia+hydrogen peroxide, hydrofluoric acid+hydrogen peroxide, and buffered hydrofluoric acid.

Silicon Nitride Etch Mask Deposition. Low-pressure chemical vapor deposition (LPCVD) was used to deposit a 300 nm-thick low stress silicon nitride coating.

Chromium Etch Mask Deposition. A thin chromium layer was also used as an etch mask. KOH was used as an etchant. The use of a chromium mask gave better control over the final pore size, and it enabled a scalable manufacturing method. Chromium itself is a somewhat weak etch mask—it slowly etches away in hot KOH. However, for the extremely short KOH etch required for a nanomembrane, 10 nm of chromium is sufficient to act as an etch stop. The improved tolerances with a chromium layer come from the better selectivity of chromium etch processes that do not etch the underlying silicon layer. The chromium films were deposited by sputter deposition of a 10 nm-thick chromium layer on the top side of the silicon. Other thin film deposition methods, such as thermal evaporation followed by annealing, would also be appropriate.

There are alternatives to a chromium mask layer. For example, a low stress silicon nitride layer could be used by skipping the silicon nitride stripping step described below. A chromium oxide layer could also be used, which can be formed either during sputtering by introducing oxygen into the sputter chamber or by oxidizing subsequent to chromium deposition at temperatures above 700° C.

Backside Patterning. Backside openings to form individual silicon membrane windows and overall membrane filter outlines were patterned by photolithography using a predesigned ad lime photomask (quartz masks would also be appropriate). An SPR 220-3 photoresist was used with an MF26A developer. Several other positive photoresists are likewise appropriate. Membrane edges were maintained parallel to the <110> direction in the silicon lattice using a mask aligner with less than a 1° misorientation (Note: a 1° misorientation causes a 1.7% expansion in pore size). The backside pattern was transferred through the silicon nitride coating to the silicon handle wafer using a reactive ion etch (RIE). A $CF_4$ plasma based RIE etch was used. $SF_6$ based plasmas can also be used.

Anisotropic Etch of Handle Wafer. The patterned sample was backside etched along (111) plane using a standard anisotropic silicon etchant with high selectivity against silicon dioxide. 45% potassium hydroxide at 95° C. was used. Other anisotropic etchants, such as TMAH, would also be appropriate. The etch was timed to remove all the silicon in the handle wafer within the pyramidal cavity region defined by the photomask pattern and terminate within the buried oxide (BOX) layer of the SOI. Note: Termination of the etch within the BOX layer can be easily verified by optical microscopy, as described below.

Silicon Nitride Stripping. The silicon nitride etch mask was removed with a high-selectivity phosphoric acid strip at 160° C. The etch was timed to strip the nitride without thinning the silicon device layer noticeably (less than 1 nm of device layer loss). Note: The etch rate of silicon in phosphoric acid was extremely small, and 1 nm of device layer thinning resulted in a 1.4 nm increase in the pore size.

Electron Beam Resist Spinning. The sample was mounted on a base chip for spinning PMMA and electron beam lithography (EBL), and the equipment used was a spinner, a substrate hot plate, and PMMA 3% Anisole.

The bulk piece of Si wafer (base chip) was cleaned using acetone and isopropyl alcohol (IPA) and dried with $N_2$. A sufficient amount of PMMA was layered on the base chip. This layer of PMMA simply acted as an easily removable glue. The base chip was spun at 1000 RPM for 30 seconds at an acceleration of 5. The membrane sample was placed on the base chip immediately after spinning, and the membrane sample and base chip combination was placed on the substrate hot plate at 60° C. for 10 minutes. The sample combination was then removed, rested for 2 minutes, and replaced back on the substrate hot plate at 180° C. for 75 seconds to finish bonding. The membrane sample was spin coated with PMMA at 2000 RPM for 60 seconds with an acceleration of 15. This layer of PMMA served as the electron beam resist. The sample was then baked on the substrate hot plate at 180° C. for 75 seconds and was inspected under an optical microscope before proceeding to electron beam lithography (EBL). NOTE: Other electron beam resists besides PMMA can also be used.

Electron Beam Lithography. pattern membranes with a desired design were patterned using a Scanning Electron Microscope (SEM). A standard operating procedure for EBL on membranes was followed. Patterns were created using a Molecular Sieve Pore Equation.

Develop EBL Pattern. In an organics fume hood, methyl isobutyl ketone (MIBK) was diluted with IPA with a ratio of 1:3. The membrane sample and base chip combination was inserted at a slight angle into the solution, and the solution was gently stirred with the sample for 80 seconds. The sample was rinsed in a beaker of IPA then dried with $N_2$. The EBL write was inspected for development issues and any issues from writing.

An alternative to the EBL process is deep ultraviolet (UV) photolithography, which is commonly used by chip manufacturers for microprocessor fabrication. If using such a method, one would replace the steps for electron beam resist spinning, EBL, and EBL developing with equivalent steps for UV photoresist spinning, deep UV photolithography, and photoresist developing.

A second alternative method is to first create a "template" porous membrane sample using EBL and then transfer the pattern from the template membrane to subsequent membrane samples through a pattern transfer process such as shadow masking.

Chrome Etch (1020AC Chromium Etchant). The sieve pattern was transferred from PMMA to a chromium (also referred to as Chrome) layer. The equipment used was a hot plate with stir bar and thermocouple, and 1020AC chrome etchant. Two DI water baths were prepared for use post-etch. 1020AC was diluted with DI water with a ratio of 2:1. The sample was etched for 15 seconds at 22° C. with the stir bar set to 200 RPM. The sample was then gently stirred in the etchant, removed after 15 seconds, and put into the first water bath. After gentle stirring in the first water bath, the sample was moved to the second bath and stirred again. The diluted Chrome etchant was replaced into the diluted etchant bottle for future use.

Standard chromium etchants will not work for EBL feature sizes below 200 nm due to the poor wetting character of PMMA with the etch solvent. Chrome etchant 1020AC (modified from typical chrome etchants by the addition of acetic acid) decreases the contact angle and fills narrower cavities in the PMMA layer.

An alternative and preferred etch method is a $CCl_4$ based reactive ion (plasma) etch (RIE), which produces vertical sidewalls in the chromium layer and can be used for pattern transfer from a template membrane sample to several other membrane samples with minimal change in dimensions. Silicon has a high etch resistance to $CCl_4$ plasmas, so the expansion in the pore size of the template membrane is minimal during such a process and will only be detected after dozens of pattern transfers. A $CCl_4$ plasma was not used in this example, as this RIE system uses other gases that are incompatible. Other user facilities have RIE units dedicated for chlorine-based plasmas.

PMMA Removal. The sample was gently submerged in a beaker of acetone until the membrane sample lifted off of the base chip. The sample was removed from the acetone, rinsed in IPA, and dried with $N_2$.

Nanoscale KOH etch. Three DI water baths were prepared for rinsing. The sample was carefully loaded into a Teflon basket as described above. The KOH sample was etched at 60° C. for 2 minutes with the stir bar set at 200 RPM. The assembled basket was rinsed through the three DI water baths before the basket was opened and the sample was removed and placed into a beaker of DI water, which was agitated gently. The sample was then rinsed in an IPA beaker, agitated gently, then dried with $N_2$.

Chromium Stripping. The membrane was placed into a non-diluted standard chromium etchant for 20 seconds to ensure all chrome was removed. The sample was run through a DI water bath, then IPA, then dried with $N_2$.

Hydrofluoric Acid (HF) Etch. To remove the BOX layer, the samples were loaded into a Teflon container with HF, and a timer was started. The samples were either etched for 30 seconds to release the silicon membrane, which would be buckled, or they were etched for 30 minutes to create an undercut ledge and flatten the membrane using the stiction-aided process described in Gopalakrishnan et al., *Appl. Phys. Lett.* 102, 033113 (2013). The etch was stopped by transferring the samples to a container with DI water and rinsed with two more DI water baths.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of fabricating a molecular sieve, the method comprising:

depositing a layer of masking material comprising silicon nitride, chromium, chromium oxide, or a chromium-gold multilayer onto a single-crystalline semiconductor membrane;

depositing an electron beam sensitive polymer over the layer of masking material;

patterning an array of holes into the electron beam sensitive polymer via electron beam lithography;

transferring the pattern of holes into the layer of masking material using a plasma or wet chemical etch to form a mask; and etching a pattern of apertures into the single-crystalline semiconductor membrane using the mask and an anisotropic chemical etch, wherein the apertures extend through the single-crystalline semiconductor membrane from an upper opening to a lower opening and have a tapered depth profile, and further wherein the lower openings have at least one lateral dimension that is smaller than 5 µm.

2. The method of claim 1, wherein the lower openings have at least one lateral dimension that is smaller than 500 nm.

3. The method of claim 1, wherein the apertures are rectangular in shape.

4. The method of claim 1, wherein the apertures are octagonal in shape.

5. The method of claim 1, wherein the apertures have a truncated square shape.

6. The method of claim 1, wherein the etched silicon membrane has an open area fraction of at least 25%.

7. The method of claim 1, wherein the standard deviation of the hole dimensions in the etched silicon membrane is 3% or lower.

8. The method of claim 1, wherein the single-crystalline semiconductor membrane is a silicon membrane.

9. The method of claim 8, wherein the etched silicon membrane has an open area fraction of at least 25%.

10. The method of claim 9, wherein the standard deviation of the hole dimensions in the etched silicon membrane is 3% or lower.

11. The method of claim 10, wherein the apertures are rectangular in shape.

12. The method of claim 11, wherein the lower openings have at least one lateral dimension that is smaller than 500 nm.

13. The method of claim 1, wherein the electron beam sensitive polymer is a positive resist.

14. The method of claim 13, wherein the electron beam sensitive polymer is polymethyl methacrylate.

15. The method of claim 13, wherein the electron beam sensitive polymer is a methyl styrene-chloromethyl acrylate copolymer.

16. The method of claim 1, wherein the anisotropic chemical etch is a wet anisotropic chemical etch.

17. The method of claim 1, wherein the electron beam sensitive polymer is a positive resist and the anisotropic chemical etch is a wet anisotropic chemical etch.

18. The method of claim 17, wherein the electron beam sensitive polymer is polymethyl methacrylate.

19. The method of claim 17, wherein the electron beam sensitive polymer is a methyl styrene-chloromethyl acrylate copolymer.

* * * * *